United States Patent
Shimamura et al.

(10) Patent No.: US 9,844,837 B2
(45) Date of Patent: Dec. 19, 2017

(54) LEAD-FREE SOLDER ALLOY

(75) Inventors: Masato Shimamura, Tokyo (JP); Tsukasa Ohnishi, Tokyo (JP); Mitsuhiro Kosai, Tokyo (JP); Kazuyori Takagi, Tokyo (JP); Tomoko Nonaka, Tokyo (JP); Masayuki Suzuki, Tokyo (JP); Toru Hayashida, Tokyo (JP); Seiko Ishibashi, Tokyo (JP); Shunsaku Yoshikawa, Tokyo (JP); Yoshie Yamanaka, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/006,538

(22) PCT Filed: Mar. 23, 2012

(86) PCT No.: PCT/JP2012/057540
§ 371 (c)(1),
(2), (4) Date: Dec. 27, 2013

(87) PCT Pub. No.: WO2012/128356
PCT Pub. Date: Sep. 27, 2012

(65) Prior Publication Data
US 2014/0141273 A1 May 22, 2014

(30) Foreign Application Priority Data

Mar. 23, 2011 (WO) .................. PCT/JP2011/056903

(51) Int. Cl.
*B23K 35/26* (2006.01)
*B23K 35/02* (2006.01)
*B23K 35/36* (2006.01)
*C22F 1/16* (2006.01)
*C22C 13/00* (2006.01)
*C22C 13/02* (2006.01)

(52) U.S. Cl.
CPC .......... *B23K 35/262* (2013.01); *B23K 35/025* (2013.01); *B23K 35/0227* (2013.01); *B23K 35/0244* (2013.01); *B23K 35/26* (2013.01); *B23K 35/3618* (2013.01); *C22C 13/00* (2013.01); *C22C 13/02* (2013.01); *C22F 1/16* (2013.01); *H01L 2924/00013* (2013.01); *H01L 2924/014* (2013.01); *Y10T 428/12222* (2015.01)

(58) Field of Classification Search
CPC .............................. B23K 35/262; C22C 13/00
See application file for complete search history.

(56) References Cited

U.S. PATENT DOCUMENTS

| 2,898,255 | A | 8/1959 | Thompson et al. |
| 3,235,414 | A | 2/1966 | Marks et al. |
| 4,561,913 | A | 12/1985 | Zado |
| 6,592,020 | B1* | 7/2003 | Currie et al. .................. 228/224 |
| 2008/0159903 | A1* | 7/2008 | Lewis et al. .................. 420/561 |
| 2008/0292492 | A1* | 11/2008 | Ingham ................ B23K 35/262 420/561 |
| 2008/0292493 | A1 | 11/2008 | Lee et al. |
| 2009/0232696 | A1 | 9/2009 | Ohnishi et al. |
| 2009/0308496 | A1* | 12/2009 | Kawamata ........... B23K 35/262 148/24 |
| 2010/0294565 | A1 | 11/2010 | Kawamata et al. |
| 2014/0061287 | A1* | 3/2014 | Ohnishi et al. ............... 228/246 |

FOREIGN PATENT DOCUMENTS

| CN | 1709638 | A | | 12/2005 |
| EP | 1245328 | A1 | | 10/2002 |
| EP | 1889684 | A1 | | 2/2008 |
| EP | 2177304 | A1 | | 4/2010 |
| GB | 2419137 | A | * | 4/2006 |
| JP | 550286 | A | | 3/1993 |
| JP | 9327790 | A | | 12/1997 |
| JP | 1043882 | A | | 2/1998 |
| JP | 2001334385 | A | * | 12/2001 |
| JP | 200218590 | A | | 1/2002 |
| JP | 2005254298 | A | | 9/2005 |
| JP | 2007237251 | A | | 9/2007 |
| JP | 2008290150 | A | | 12/2008 |
| WO | 2006129713 | A1 | | 12/2006 |
| WO | 2009011341 | A1 | | 1/2009 |

OTHER PUBLICATIONS

Machine translation of JP2001-334385 A, Dec. 2001.*
Puttlitz et al. "Handbook of Lead-Free solder Technology for Microelectronic Assemblies: Chapter VI. Flux Chemistry and Technology", Dec. 31, 2004, p. 376, Marcel Dekker Inc., New York, USA.

* cited by examiner

*Primary Examiner* — Xiaowei Su
(74) *Attorney, Agent, or Firm* — The Webb Law Firm

(57) ABSTRACT

By using a solder alloy consisting essentially of 0.2-1.2 mass % of Ag, 0.6-0.9 mass % of Cu, 1.2-3.0 mass % of Bi, 0.02-1.0 mass % of Sb, 0.01-2.0 mass % of In, and a remainder of Sn, it is possible to obtain portable devices having excellent resistance to drop impact and excellent heat cycle properties without developing thermal fatigue even when used in a high-temperature environment such as inside a vehicle heated by the sun or in a low-temperature environment such as outdoors in snowy weather.

5 Claims, No Drawings

LEAD-FREE SOLDER ALLOY

CROSS-REFERENCE TO RELATED APPLICATIONS

This application is the United States national phase of International Application No. PCT/JP2012/057540 filed Mar. 23, 2012, and claims priority to International Application No. PCT/JP2011/056903 filed Mar. 23, 2011, the disclosures of which are hereby incorporated in their entirety by reference.

TECHNICAL FIELD

This invention relates to a solder alloy which does not contain lead and particularly a lead-free solder alloy which is suitable for a solder paste used for substrates for surface mounting and for flux-cored solder used for repairs.

BACKGROUND ART

Methods of soldering electronic parts include soldering with a soldering iron, flow soldering, reflow soldering, and the like.

Reflow soldering is a method in which a solder paste comprising a solder powder and a flux is supplied only to necessary locations of a printed circuit board by printing or with a dispenser, electronic parts are placed on the coated portions, and then the solder paste is melted in a heating apparatus such as a reflow furnace to solder the electronic parts to the printed circuit board. In the reflow method, not only is it possible to solder a large number of locations in a single operation, but bridging does not take place even if electronic parts are soldered with a narrow pitch and solder does not adhere to unnecessary locations. Therefore, soldering can be carried out with excellent productivity and reliability.

In the past, a Pb—Sn alloy was used in solder. This Pb—Sn alloy has a melting point of 183° C. for a eutectic composition (Pb-63Sn), so it has little thermal effect even on electronic parts having poor heat resistance. In addition, it has excellent solderability. Therefore, it has the advantages that it produces few soldering defects such as unsoldered portions or dewetting.

However, due to the problem of the toxicity of Pb, a strong demand has developed in recent years in the electronic equipment industry for so-called lead-free solder which does not contain Pb.

Lead-free solders which are currently widely used are ones having an Sn—Ag—Cu composition like that described in JP 5-050286 A, which contains 3-5 mass % of Ag and 0.5-3 mass % of Cu. Because this lead-free solder has superior heat cycle properties and creep properties compared to a conventional Sn—Pb solder, its use is spreading. Particularly heat cycle properties are an important factor in evaluation of the life span of electronic devices and in guaranteeing products.

Currently used lead-free solder alloys having an Sn—Ag—Cu composition are hard compared to conventionally used Sn—Pb solder. Therefore, when they are used in small devices such as mobile phones and if the devices are accidentally dropped, cracks develop in the interface between the electronic parts and solder joints, so these solders have the problem that so-called interfacial peeling easily occurs. Interfacial peeling does not readily occur with substrates soldered by flow soldering in which a relatively large amount of solder is used in solder joints. However, it easily occurs with substrates which are soldered by reflow soldering and which have minute joints formed using a small amount of solder.

Reflow soldering of substrates is performed using solder paste, solder balls, solder preforms, and the like. In addition, flux-cored solder is used to repair solder joints. Printed circuit boards in which these solder materials are used produce the problem of interfacial peeling particularly easily.

The present applicant disclosed a solder alloy having an Ag content of 0.8-2.0 mass %, a Cu content of 0.05-0.3 mass %, and further containing In, Ni, Pt, Sb, Bi, Fe, Al, and P as a solder alloy having good resistance to drop impact (resistance to impact due to dropping) for use in soldering to Cu lands (WO 2006/129713 A1).

As a solder alloy having excellent resistance to heat cycles, they also disclosed an Sn—Ag—Cu—Bi based lead-free solder which is an Sn—Ag—Cu based solder alloy containing solid solution elements and which has an alloy structure at room temperature comprising either a supersaturated solid solution or a solid solution in which solid solution elements are precipitated and which has an alloy structure at a high temperature in a cycle environment comprising a solid solution in which the solid solution elements precipitated at a low temperature are redissolved in the Sn matrix (WO 2009/011341 A1).

There is also disclosed a solder alloy in which Bi and Sb are added to an Sn—Ag—Cu solder composition such that Bi and Sb form solid solutions with Sn and Ag and Cu form intermetallic compounds with Sn, whereby mechanical strength is maintained by the microstructure formed from these solid solutions and intermetallic compounds (JP 9-327790 A).

PRIOR ART DOCUMENT

Patent Documents

Patent Document 1: WO 2006/129713 A1
Patent Document 2: WO 2009/011341 A1
Patent Document 3: JP 9-327790 A

SUMMARY OF THE INVENTION

Problems which the Invention is to Solve

A lead-free solder alloy cannot be said to have good resistance to drop impact and particularly good resistance to drop impact of solder joints having a small soldered area. Recent electronic devices are becoming higher in performance and smaller in size. As a result, electronic parts employed in devices are also becoming smaller and higher in performance. Despite an increase in the number of electrodes in recent electronic devices, the overall size of the devices is becoming smaller. Solder joints formed on the electrodes of electronic parts which are becoming smaller in this manner are also becoming smaller. However, if the solder of small solder joints made of lead-free solder has poor resistance to drop impact, the solder joints easily peel off when electronic devices receive an impact due to dropping, and the electronic devices can no longer function.

This problem does not readily occur with portable electronic devices such as remote controls which have relatively large printed circuit boards which are soldered by flow soldering in which a large amount of solder is adhered. However, in the case of products such as mobile phones or mobile computers which are small and have a high density of parts and are exclusively soldered by reflow soldering using a solder paste or solder balls, the amount of solder used for solder joints is extremely small.

The heat cycle properties of electronic devices are an important factor in determining the life span of electronic devices. Mobile phones and portable computers are not always used in well air-conditioned rooms, and it is not unusual to use them in high-temperature environments such as inside an automobile or in low-temperature environments such as outdoors in snowy weather. Therefore, excellent heat cycle properties are essential, and solder used for portable devices must have excellent heat cycle properties.

Namely, depending upon the environment of use of electronic devices, solder joints used in electronic devices repeatedly expand and contract, cracks enter the solder joints, and ultimately the solder joints are destroyed. This phenomenon is generally referred to as thermal fatigue. There is a demand for a solder alloy for use in mobile phones and portable computers which does not develop thermal fatigue and which has good heat cycle properties.

However, solder having excellent resistance to drop impact cannot be said to also have excellent heat cycle properties. For example, a conventional solder alloy which takes into consideration resistance to drop impact such as that described in Patent Document 1 reduces the content of Ag and Cu in an Sn—Ag—Cu solder so as to prevent thickening of intermetallic compounds such as Cu6Sn5 and Ag3Sn which develop at the interface between electrodes and solder joints, thereby preventing peeling from occurring at the interface between electrodes and solder joints and guaranteeing resistance to drop impact. However, if the content of Ag and Cu in a conventional Sn—Ag—Cu based solder alloy is decreased, although resistance to drop impact increases, the problem develops that heat cycle properties, which are superior for an Sn—Ag—Cu solder alloy, end up worsening. In this manner, a solder alloy which is good in both heat cycle properties and resistance to drop impact has not been developed.

The problem to be solved by the present invention is to provide a solder alloy having excellent resistance to drop impact while maintaining the heat cycle properties which are characteristic of an Sn—Ag—Cu based solder alloy.

Means for Solving the Problems

The present inventors discovered that if an Sn—Ag—Cu based solder alloy has a composition having a Cu content removed from the vicinity of the eutectic, heat cycle properties worsen, while a composition in which Ag is removed from the vicinity of the eutectic has less worsening of heat cycle properties compared to when Cu is removed from the eutectic. In addition, heat cycle properties are improved by adding In along with Bi and Sb instead of decreasing the Ag content. As a result, they completed the present invention.

The present invention is a lead-free solder alloy characterized by consisting essentially of 0.2-1.2 mass % of Ag, 0.6-0.9 mass % of Cu, 1.2-3.0 mass % of Bi, 0.02-1.0 mass % of Sb, 0.01-2.0 mass % of In, and a remainder of Sn.

When a solder joint of an electronic device is subjected to heat cycles, the solder structure of the solder joint is coarsened. Therefore, a fine solder structure generally has excellent heat cycle properties. In Patent Document 3, the Ag content of the solder alloy used in the examples is 3.0 mass % or 3.4 mass %, so the solder alloy has an Ag content near the eutectic composition. In the present invention, the Ag content is made 0.2-1.2 mass % in order to impart resistance to drop impact. If the solder alloy composition consisted essentially of Sn, Ag, Cu, Bi, and Sb, the heat cycle properties would not be good. Therefore, in the present invention, by adding In along with Bi and Sb to an Sn—Ag—Cu solder alloy composition, even if the Ag content is made a low value of 0.2-1.2 mass %, not only is there little thermal fatigue in the same manner as with a conventional Sn—Ag—Cu—Bi—Sb composition, but a solder alloy having good heat cycle properties is unexpectedly obtained.

In (indium) which is added to a solder alloy according to the present invention is a metal which forms a solid solution with Sn in the same manner as do Bi and Sb. Indium which is added to a solder alloy according to the present invention has a smaller atomic weight than Bi or Sb, which also form a solid solution with Sn. Therefore, due to In entering between Bi or Sb atoms, it is possible to form a solder alloy of a solid solution strengthening type having excellent resistance to heat cycles. In particular, if the content of Bi which has the largest atomic weight among Bi, Sb, and In is at least two times the content of In in atomic percent, namely if the content of Bi in mass % is at least approximately four times as large as for In, the heat cycle properties are further improved due to In entering into gaps between Bi atoms. More preferably, the Bi content is at least 3 times the content of In in atomic percent.

However, like Zn and similar elements, In has violent reactivity. If In is used in a solder paste, the solder paste is considered difficult to deal with because it is susceptible to changes in the viscosity of the solder paste over time. In the present invention, by limiting the content of In which is added to a solder alloy and limiting the organic acid used in a flux of a solder paste, it is possible to use the solder alloy in a solder paste.

Effects of the Invention

A solder alloy according to the present invention makes it possible to obtain a portable device having excellent resistance to drop impact such that solder joints are not damaged even when a portable device having a fine soldered pattern is dropped. In addition, a solder alloy according to the present invention makes it possible to obtain a portable device which has excellent heat cycle properties and which does not develop thermal fatigue even when it is used in a high-temperature environment such as inside a vehicle heated by the sun or in a low-temperature environment such as outdoors in snowy weather.

Although a solder alloy according to the present invention contains In, even if a solder alloy according to the present invention is formed into a powder and made into a solder paste, it is possible to obtain an excellent solder paste which experiences little change in viscosity over time.

MODES FOR CARRYING OUT THE INVENTION

In general, in an Sn based lead-free solder, Ag is effective at providing resistance to heat cycles, but if a large amount of Ag is added, resistance to drop impact decreases. In a lead-free solder according to the present invention, if the added amount of Ag is smaller than 0.2 mass %, the amount of Sn—Ag intermetallic compounds formed in the solder alloy is insufficient, and the effect of refining the solder structure and hence the effect of improving resistance to heat cycles are not realized. If the added amount of Ag exceeds 1.2 mass %, a large amount of Ag3Sn intermetallic compound forms inside the solder and a mesh-like structure is obtained, so the strength of the material increases and resistance to impact worsens. Therefore, the added amount of Ag is made at most 1.2 mass %. The added amount of Ag in a solder alloy according to the present invention is 0.2-1.2 mass %, and more preferably the added amount of Ag in a solder alloy according to the present invention is 0.5-1.0 mass %.

If the Cu content in a lead-free solder according to the present invention is lower than 0.6 mass %, the amount of Sn—Cu intermetallic compounds formed in the solder alloy is insufficient, and the effect of refining the solder structure and hence the effect of improving resistance to heat cycles are not realized. If the Cu content is larger than 0.9 mass %, at the time of solidification of the solder, a Cu6Sn5 intermetallic compound layer becomes primary crystals and melting properties of the solder are impaired. Therefore, the added amount of Cu in a solder alloy according to the present invention is 0.6-0.9 mass % and preferably 0.7-0.8 mass %.

If the Bi content in a solder according to the present invention is lower than 1.2 mass %, the amount of solid solution Bi formed with Sn in the solder alloy is small, so the effect of improving heat cycle properties is not obtained. However, if the Bi content is larger than 3.0 mass %, the hardness of the solder abruptly increases and ductility disappears, causing resistance to drop impact to become poor. Therefore, the added amount of Bi is made at most 3.0 mass %. The added amount of Bi in a solder alloy according to the present invention is 1.2-3.0 mass %, and preferably the added amount of Bi in a solder alloy according to the present invention is 1.5-2.0 mass %. More preferably the lower limit on Bi is 1.6 mass %.

If the Sb content in the present invention is lower than 0.02 mass %, the amount of solid solution Sb formed with Sn in the solder alloy becomes too small to give the effect of improving heat cycle properties. On the other hand, if the content of Sb is larger than 1.0 mass %, AgSb intermetallic compound is formed in the solder, causing resistance to drop impact to worsen.

In addition, if the Sb content is larger than 1.0 mass %, the wettability of the solder worsens and the formation of voids increases. Therefore, the added amount of Sb is made at most 1.0 mass %. The added amount of Sb in a solder alloy according to the present invention is 0.02-1.0 mass %, and the added amount of Sb in a preferred solder alloy according to the present invention is 0.15-0.5 mass %.

The addition of In to a solder alloy has the effect of improving heat cycle properties. However, because In is an easily oxidizable metal, a solder alloy containing it is easily oxidized. As a result of oxidation of In, yellowing of a soldered alloy occurs and voids end up developing in solder joints. Therefore, it is necessary to limit the added amount of In. In addition, if a solder alloy containing In is formed into a powder and mixed with a flux to form a solder paste, In and the flux react and cause the viscosity of the solder paste to easily vary with the passage of time.

If the In content in the present invention is lower than 0.01 mass %, the amount of solid solution of Sn and In formed in the solder alloy is small, and the effect of improving heat cycle properties is not realized. On the other hand, if the In content is greater than 2.0 mass %, yellowing of the surface of solder bumps develops after reflow heating and the occurrence of voids also increases, which is undesirable. The added amount of In in a solder alloy according to the present invention is 0.1-2.0 mass %. Preferably the added amount of In in a solder alloy according to the present invention is 0.2-0.5 mass %.

A solder paste of a solder alloy containing In easily undergoes changes in viscosity with time because In is a highly reactive metal. By limiting the content of In, a solder alloy according to the present invention prevents changes in a solder paste over time, and a reaction between the flux and the In-containing solder powder can be prevented by using a special flux for In.

A flux according to the present invention is a flux containing a rosin, a solvent, a thixotropic agent, an activator, and an organic acid as an auxiliary activator. The organic acid used as an auxiliary activator is selected from organic acids having low reactivity with In such as succinic acid, adipic acid, and azelaic acid. As a result, a change in viscosity of a solder paste over time due to a reaction between a flux and solder powder can be avoided. The auxiliary activator is added to a flux in order to increase its wettability when the amount of halides and the like used as the main activator is limited in order to increase resistance to corrosion. The auxiliary activator is added as an activator which does not contain a halogen element.

If the total amount of succinic acid, adipic acid, and azelaic acid used in a flux according to the present invention is less than 0.5 mass %, the effect of the auxiliary activator is not obtained, whereby wettability is poor and there are many defects such as solder balling. If it is added in an amount of 5 mass % or greater, even with an organic acid having low reactivity with In such as succinic acid, adipic acid, or azelaic acid, the acid reacts with In and changes occur over time. Accordingly, the total amount of succinic acid, adipic acid, and azelaic acid added to a flux in the present invention is at least 0.5 mass % and less than 5.0 mass %.

A solder alloy according to the present invention can be used not only as a solder paste as described above, but it can be used in the form of solder balls, flux-cored solder, or a solder preform.

EXAMPLES

Solder powders having the solder compositions (mass %) of the examples and comparative examples in Table 1 and a flux having the flux composition of Example 13 in Table 2 were mixed to prepare a solder paste, and a heat cycle test was carried out when 3216-size resistors having Sn-plated electrodes were mounted on a printed circuit board. In addition, a drop impact test was carried out using a CSP having solder balls with a diameter of 0.3 mm for mounting which was similarly mounted on a printed circuit board.

The results of the heat cycle test and the drop impact test are shown in Table 1 below.

In Table 1, Comparative Example 2 is a solder alloy composition as disclosed in Patent Document 1, Comparative Examples 3 and 4 are solder alloy compositions as disclosed in Patent Document 2, and Comparative Example 5 is a solder alloy composition as disclosed in Patent Document 3.

[Drop Impact Test]

1. An impact was imparted between a CSP having solder bumps formed thereon and a printed circuit board by dropping, and the number of drops until cracks developed in solder joints was measured. The circuit board was left for 5 days at room temperature after soldering. The number of drops when the electrical resistance increased by 50% from the initial value was recorded as an indication of the progress of cracks.

2. The steps in the drop impact test were as follows.

1) A flux was printed on a CSP having outer dimensions of 12×12 (mm) and 196 bump electrodes with electrolytic Ni/Au plating, and solder balls having the compositions shown in Table 1 and a diameter of 0.3 mm were placed thereon.

2) The CSP having solder balls placed thereon was heated in a reflow furnace to form solder bumps on the electrodes.

3) The CSP on which solder bumps were formed was mounted at the center of a glass epoxy printed circuit board which measured 30×120 (mm) and to which a solder paste was applied, and it was heated in a reflow furnace to solder the CSP to the printed circuit board.

4) Both ends of the printed circuit board to which the CSP was soldered were secured atop a dropping jig with a spacing of 1 centimeter from the dropping jig.

5) The dropping jig was dropped from a height so as to impart an acceleration of 1500 G to the dropping jig so as to impart an impact to the printed circuit board. At this time, the printed circuit board secured to the dropping jig at both of its ends vibrated at its center, and as a result of this vibration, an impact was imparted to the solder joints between the printed circuit board and the CSP. The number of drops in this dropping test until cracks developed in the solder joints of the CSP was measured. The test results were recorded in six points and the lowest value was recorded.

[Heat Cycle Test]

1. The test method was prescribed by JIS C 0025. The effect of repeatedly applying temperature variations in the form of a high temperature and a low temperature to solder joints was investigated. The result of this test is used as an index of the life span of electronic equipment.

2. The steps in the heat cycle test were as follows.

1) Resistors having outer dimensions of 3.2×1.6 (mm) and Sn-plated electrodes were placed on a glass epoxy printed circuit board which was coated with a solder paste and heated in a reflow furnace to carry out soldering.

2) The soldered printed circuit board was placed into a 2-chamber automatic test apparatus which was set for 30 minutes each at a low-temperature condition of −40° C. and a high-temperature condition of +85° C. A shear strength test was carried out on 150 solder joints initially and by removing the printed circuit board at the 800th cycle, the 1200th cycle, the 1600th cycle, and the 2000th cycle, and the change in strength with respect to the initial strength was ascertained.

3) At the lowest strength in each cycle, a marked percent decrease in strength (50% or less of the initial value) or the state at which the strength became 10 N or lower was considered deterioration, and the number of cycles at this point was recorded.

As can be seen from Table 1, a lead-free solder alloy according to the present invention was outstandingly superior to the lead-free solders of the comparative examples in the drop impact test, and its heat cycle properties showed no marked deterioration in strength even after a long period of heat cycles.

[Test of Changes in Viscosity over Time]

Next, solder powder was prepared using the solder composition of Example 4 in Table 1, and it was mixed with a flux having the flux composition (mass %) shown in Table 2 to prepare a solder paste. The solder paste was subjected to a solder balling test, and it was also tested to ascertain changes in the viscosity of the solder paste over time.

The solder balling test was carried out in accordance with JIS Z 3284 Appendix 11. Category 1 and 2 in FIG. 1 of JIS Z 3284 Appendix 11 were evaluated as excellent, category 3 was evaluated as good, and category 4 was evaluated as poor.

Changes in the viscosity of the solder paste over time were measured in accordance with JIS Z 3284 Appendix 6 using a Model PCU-205 viscometer manufactured by Malcom Co., Ltd. Viscosity was measured at 25° C. at a rotational speed of 10 rpm for 10 hours. Samples for which the viscosity increased by at least 20% of the initial viscosity were evaluated as poor, those for which the increase in viscosity was at least 10% to less than 20% were evaluated as good, and those for which the increase in viscosity was less than 10% were evaluated as excellent. The results of the solder balling test and the test of the change in viscosity of the solder paste over time are shown in Table 2.

As can be seen from Table 2, in spite of a solder according to the present invention containing In which easily produces changes in a solder paste, a solder paste having stable viscosity can be obtained. In addition, there was little solder balling after reflow, and it was possible to obtain solder joints with no defects.

TABLE 1

| | | Solder composition | | | | | Drop impact test (number of drops) | Heat cycle properties | Others |
|---|---|---|---|---|---|---|---|---|---|
| | Sn | Ag | Cu | Bi | Sb | In | | | |
| EXAMPLE | | | | | | | | | |
| 1 | rem | 0.2 | 0.6 | 1.2 | 0.02 | 0.01 | 37 | 1600 | |
| 2 | rem | 0.3 | 0.7 | 1.6 | 0.02 | 0.20 | 45 | 2000 | |
| 3 | rem | 0.5 | 0.7 | 1.6 | 0.20 | 0.20 | 32 | 2000 | |
| 4 | rem | 1.0 | 0.7 | 1.6 | 0.02 | 0.20 | 26 | 2000 | |
| 5 | rem | 1.0 | 0.9 | 2.5 | 0.10 | 0.50 | 25 | 2000 | |
| 6 | rem | 1.2 | 0.9 | 2.5 | 1.00 | 1.00 | 21 | 2000 | |
| 7 | rem | 0.5 | 0.8 | 1.6 | 0.20 | 0.50 | 33 | 2000 | |
| 8 | rem | 1.0 | 0.8 | 1.6 | 0.02 | 0.01 | 23 | 2000 | |
| 9 | rem | 0.5 | 0.9 | 2.0 | 0.20 | 0.20 | 34 | 2000 | |
| 10 | rem | 0.5 | 0.6 | 2.0 | 0.02 | 0.20 | 35 | 2000 | |
| 11 | rem | 0.5 | 0.9 | 2.5 | 0.20 | 0.20 | 41 | 2000 | |
| 12 | rem | 0.5 | 0.9 | 2.5 | 0.02 | 0.20 | 40 | 2000 | |
| COMPARATIVE | | | | | | | | | |
| 1 | rem | 0.1 | 0.5 | 10.0 | 0.01 | 0.01 | 1 | 2000 | |
| 2 | rem | 1.0 | 0.1 | — | — | 0.02 | 19 | 1600 | PD 1 |

TABLE 1-continued

|   | Solder composition | | | | | | Drop impact test (number of drops) | Heat cycle properties | Others |
|---|---|---|---|---|---|---|---|---|---|
|   | Sn | Ag | Cu | Bi | Sb | In | | | |
| 3 | rem | 1.0 | 0.5 | 2.5 | — | — | 15 | 1200 | PD 2 |
| 4 | rem | 3.0 | 1.0 | 3.0 | — | 0.80 | 1 | 2000 | PD 2 |
| 5 | rem | 3.0 | 0.6 | 3.0 | 0.60 | — | 2 | 2000 | PD 3 |
| 6 | rem | 1.5 | 1.0 | 5.0 | 2.00 | 5.00 | 13 | — | |
| 7 | rem | 0.5 | 1.0 | 1.0 | 0.20 | 0.20 | 36 | 1400 | |
| 8 | rem | 0.5 | 0.5 | 1.0 | 0.02 | 0.20 | 34 | 1400 | |
| 9 | rem | 1.0 | 1.0 | 3.2 | 0.20 | 0.20 | 14 | 1600 | |
| 10 | rem | 1.5 | 0.8 | 3.2 | 0.02 | 0.20 | 11 | 2000 | |
| 11 | rem | 1.5 | 0.7 | 1.6 | 0.02 | 0.20 | 18 | 2000 | |

PD: Patent Document

TABLE 2

| Material | Example | | | | | | | | | Comparative Example | | | |
|---|---|---|---|---|---|---|---|---|---|---|---|---|---|
|  | 13 | 14 | 15 | 16 | 17 | 18 | 19 | 20 | 21 | 12 | 13 | 14 | 15 |
| Denatured rosin | 41 | 41 | 41 | 41 | 41 | 41 | 41 | 41 | 41 | 41 | 41 | 42 | 41 |
| Polymerized rosin | 8 | 8 | 8 | 8 | 8 | 8 | 8 | 8 | 8 | 8 | 8 | 8 | 8 |
| Diethylene glycol monohexyl ether | 40.5 | 40.0 | 39.5 | 40.5 | 39.5 | 41.0 | 40.0 | 39.0 | 40.0 | 39.0 | 39.0 | 43.0 | 40.0 |
| Hardened castor oil | 6 | 6 | 6 | 6 | 6 | 6 | 6 | 6 | 6 | 6 | 6 | 6 | 6 |
| Diphenylguanidine HBr | 0.5 | 0.5 | 0.5 | 0.5 | 0.5 | 0.5 | 0.5 | 0.5 | 0.5 | 0.5 | 0.5 | 0.5 | 0.5 |
| Succinic acid | 0.5 | 1.0 | 1.5 | 1.0 | 1.0 | 0.5 | 0.5 | 1.0 | 1.5 | 2.0 | 1.0 | 0.2 | 1.0 |
| Adipic acid | 3.0 | 3.0 | 3.0 | 2.5 | 3.5 | 2.5 | 3.5 | 3.5 | 2.5 | 3.0 | 4.0 | 0.2 | — |
| Sebacic acid | — | — | — | — | — | — | — | — | — | — | — | — | 3.0 |
| Total | 100 | 100 | 100 | 100 | 100 | 100 | 100 | 100 | 100 | 100 | 100 | 100 | 100 |
| Solder balling | Good | Excel. | Excel. | Good | Excel. | Good | Good | Excel. | Excel. | Excel. | Excel. | Poor | Poor |
| Stability with time | Excel. | Good | Good | Good | Good | Excel. | Good | Good | Good | Poor | Poor | Excel. | Poor |

INDUSTRIAL APPLICABILITY

The object of the present invention is to increase the impact resistance of minute solder joints. As applications in which this object is realized, a solder according to the present invention can be used for typical soldering which includes the formation of solder bumps and can achieve an effect with respect to resistance to drop impact. When forming solder bumps, a solder is often used in the form of solder balls or solder paste. The resulting minute solder joints may be repaired using flux-cored solder. It is thought that the effects of the present invention are also exhibited when used in the form of flux-cored solder.

The invention claimed is:

1. A lead-free solder alloy consisting of 0.2-1.0 mass % of Ag, 0.6-0.9 mass % of Cu, 1.2-2.0 mass % of Bi, 0.02-0.5 mass % of Sb, 0.01-0.3 mass % of In, and a remainder of Sn, wherein the mass % of Bi is at least 4 times greater than the mass % of In.

2. A lead-free solder paste in which a solder powder of the lead-free solder alloy according to claim 1 is mixed with a flux, wherein the flux contains a total of at least 0.5 mass % and less than 5.0 mass % of at least one organic acid selected from the group consisting of succinic acid, adipic acid, and azelaic acid.

3. A flux-cored solder comprising a solder wire of the lead-free solder alloy according to claim 1, having its center filled with a flux, wherein the flux contains at least one organic acid selected from the group consisting of succinic acid, adipic acid, and azelaic acid.

4. A solder ball made from the lead-free solder alloy according to claim 1.

5. A solder preform made from the lead-free solder alloy according to claim 1.

* * * * *